United States Patent
Chen et al.

(10) Patent No.: US 6,960,525 B2
(45) Date of Patent: Nov. 1, 2005

(54) METHOD OF FORMING METAL PLUG

(75) Inventors: Yi-Nan Chen, Taipei (TW); Hui-Min Mao, Taipei (TW)

(73) Assignee: Nanya Technology Corporation, Taoyuan (TW)

( * ) Notice: Subject to any disclaimer, the term of this patent is extended or adjusted under 35 U.S.C. 154(b) by 196 days.

(21) Appl. No.: 10/437,322

(22) Filed: May 13, 2003

(65) Prior Publication Data

US 2004/0192026 A1    Sep. 30, 2004

(30) Foreign Application Priority Data

Mar. 25, 2003 (TW) .............................. 92106602 A

(51) Int. Cl.$^7$ ...................... H01L 21/4763; H01L 21/44
(52) U.S. Cl. ...................... 438/682; 438/630; 438/637; 438/649; 438/586; 438/664
(58) Field of Search ............................... 438/682–683, 438/637–639, 649, 783, 586, 664, 630, 770

(56) References Cited

U.S. PATENT DOCUMENTS 6,461,963 B1 * 10/2002 Givens et al. .............. 438/692

\* cited by examiner

Primary Examiner—Ha Tran Nguyen
(74) Attorney, Agent, or Firm—Quintero Law Office

(57) ABSTRACT

A method of forming a metal plug. First, a dielectric layer is formed on a substrate. Next, a patterned hard mask is formed on the dielectric layer. The dielectric layer is etched through the patterned hard mask to form a contact hole in the dielectric layer so as to expose parts of the substrate. An isolated layer is formed on the patterned hard mask. A barrier is then formed conformally on the isolated layer and the exposed substrate of the contact hole. A metal layer is formed to fill the contact hole and cover the barrier. A thermal treatment is performed to form a silicide between the barrier layer and the substrate. Finally, parts of the metal layer, barrier, isolated layer, and patterned hard mask are removed. The metal plug with a planar surface is thus formed in the contact hole.

28 Claims, 5 Drawing Sheets

METHOD OF FORMING METAL PLUG

BACKGROUND OF THE INVENTION

1. Field of the Invention

The present invention relates to a semiconductor manufacturing process and in particular to a method of modifying conductive wiring.

2. Description of the Related Art

As the number of devices that may be included on a single semiconductor chip increases, the size of the device is reduced and the thickness of the photoresist layer is also reduced. Otherwise, light cannot reach the bottom of the thick photoresist layer during photolithography, such that the desired patterns cannot be precisely transferred on to the semiconductor substrate. Thus, a hard mask comprised of poly-silicon is proposed to replace the photoresist layer. The thickness of the hard mask can be greatly reduced for new generation manufacturing processes, to as little as 0.11 μm or less.

However, it is difficult to remove the poly-silicon hard mask in the plug formation process. Conventionally, a barrier comprising TiN/Ti is usually formed between the semiconductor substrate and the poly-silicon hard mask. In order to enhance the conductivity between the barrier and the substrate, a thermal treatment is usually performed, wherein the TiN/Ti barrier and the silicon substrate react with each other to form a highly conductive silicide. There is however, also a silicide formed between the poly-silicon hard mask and the TiN/Ti barrier. As a result, the silicide between the poly-silicon hard mask and the TiN/Ti barrier is difficult to remove by chemical mechanical polishing.

SUMMARY OF THE INVENTION

Accordingly, an object of the invention is to provide a method of forming a metal plug to avoid formation of silicide on the hard mask, which results in difficulty when conventionally removing the hard mask.

One feature of the present invention is the use of an isolated layer comprising an oxide between the poly-silicon hard mask and TiN/Ti barrier to prevent the poly-silicon hard mask and TiN/Ti barrier from reacting with each other thus forming a silicide which is difficult to remove by chemical mechanical polishing (CMP).

Another feature of the present invention is the formation of an isolated layer by chemical cleaning utilizing specific chemical solutions. A hydrophobic solution with a specific weight of more than 1 is spin coated at a slow rate to clean the surface and the side wall of the contact hole. Then, a solution containing water is spin coated at a high rate on the patterned hard mask to form the oxide on the patterned hard mask.

To achieve the above objects, one aspect of the present invention provides a method of forming a metal plug. First, a dielectric layer is formed on a substrate. Next, a patterned hard mask is formed on the dielectric layer. The dielectric later is etched through the patterned hard mask to form a contact hole in the dielectric layer so as to expose parts of the substrate. An isolated layer is formed on the patterned hard mask. A metal barrier layer is then formed conformally on the isolated layer and the exposed substrate of the contact hole. A metal layer is formed to fill the contact hole and cover the metal barrier layer. A thermal treatment is performed to form a salicide between the metal barrier layer and the substrate. Finally, parts of the metal layer, metal barrier layer, isolated layer, and patterned hard mask are removed. A metal plug with a planar surface is thus formed in the contact hole.

According to the present invention, the isolated layer comprises an oxide. Thus, the step of forming an oxide comprises the following steps. First, a hydrophobic solution with a specific weight of more than 1 is spin coating in the contact hole to clean the surface and the side wall of the contact hole. Next, a solution containing water is spin coated on the patterned hard mask to form the oxide on the patterned hard mask.

According to the present invention, the hydrophobic solution with a specific weight of more than 1 comprises chlorohydrocarbon comprising chloroform or dichloromethane. The spin rate of the hydrophobic solution with a specific weight of more than 1 is about 800~1000 rpm.

According to the present invention, the solution containing water comprises $H_2O_2$. The spin rate of the solution containing water is about 2000~3000 rpm.

The step of removing parts of the metal layer, barrier layer, isolated layer, and patterned hard mask is performed by chemical mechanical polishing (CMP).

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

A preferred embodiment of the present invention is now described with reference to the figures.

Figure 1A:
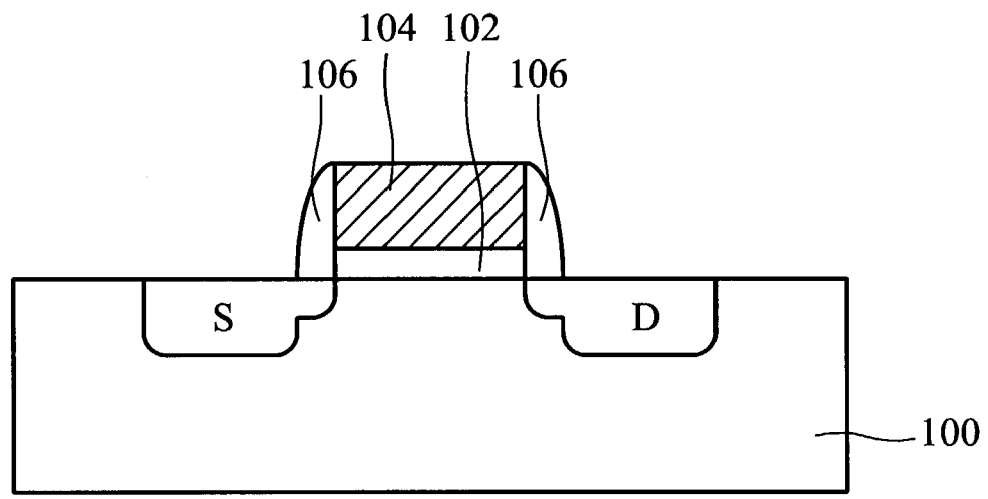
FIGS. 1A through 1J are cross-sections showing the method of forming a metal plug according to one embodiment of the invention.

First, in FIG. 1A, a semiconductor substrate 100 is provided. The semiconductor substrate material 100 is comprised of silicon. The silicon substrate 100 comprising a gate structure including a gate layer 104 and a gate dielectric layer 102 formed between the silicon substrate 100 and the gate layer 104, a source drain S/D formed beside the gate structure, and the source drain S/D, and spacers on the side walls of the gate structure.

Figure 1B:
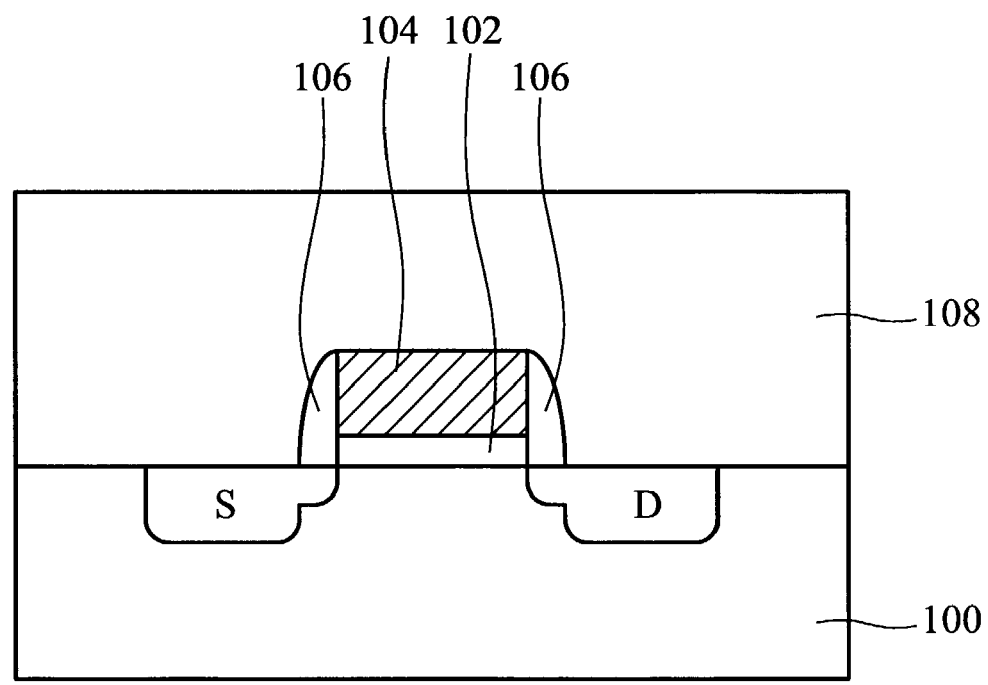

Next, a dielectric layer 108 is formed to cover the gate structure and the source drain S/D, as shown in FIG. 1B. The material of the dielectric layer comprises a boro-phspho silicate glass (BPSG), a high density plasma (HDP) oxide, or tetraethylorthosilicate (TEOS).

Figure 1C:
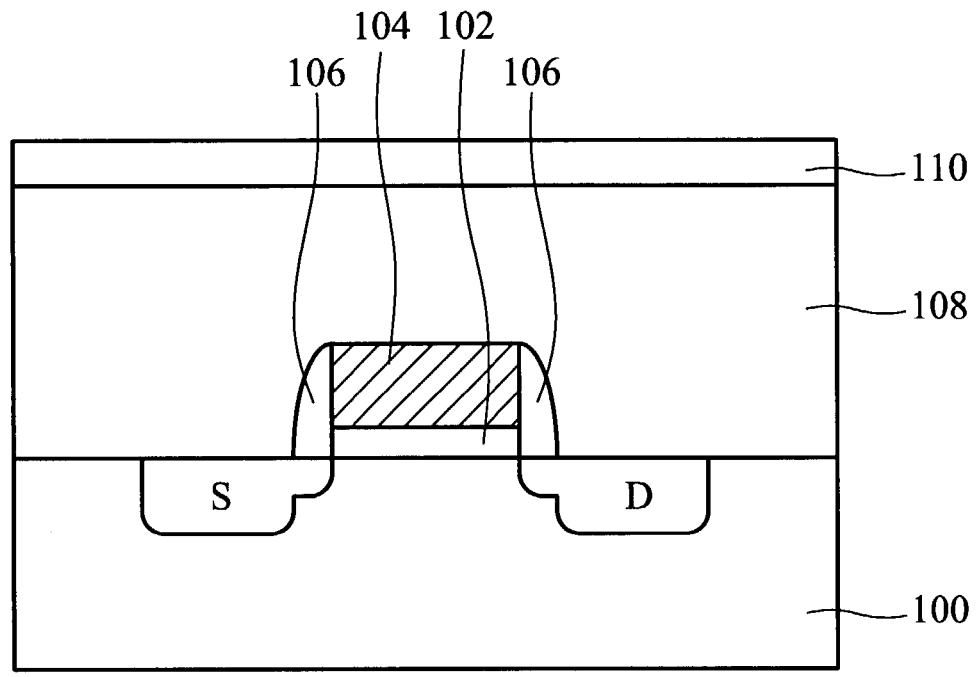

In FIG. 1C, a hard mask 110 is preferably formed on the dielectric layer 108 by chemical vapor deposition (CVD).

Figure 1D:
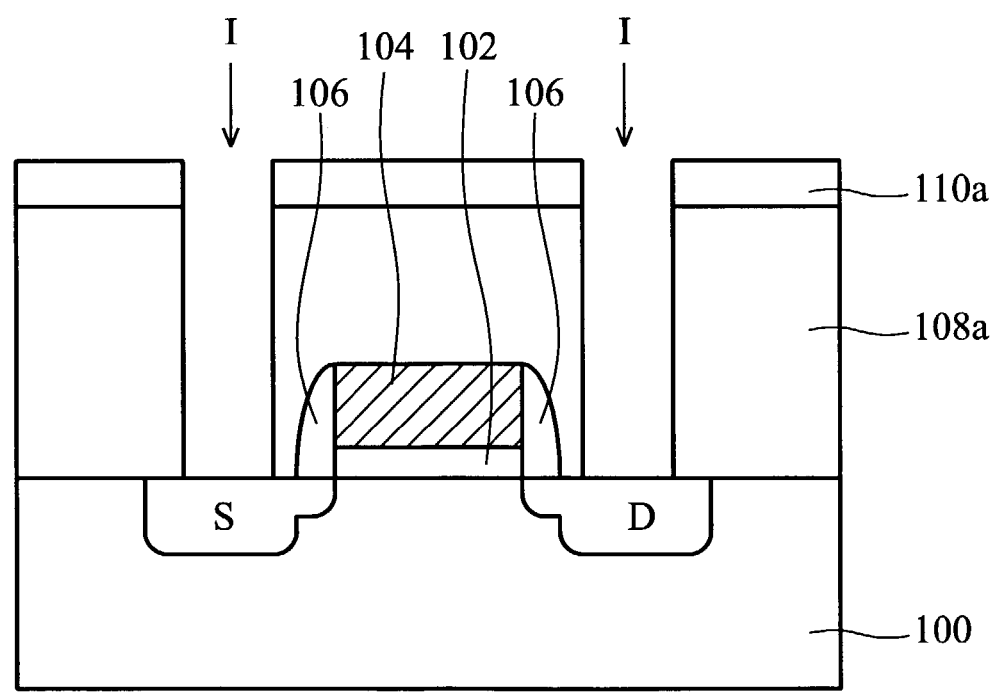

In FIG. 1D, the hard mask 110 is preferably patterned by photolithography and etching. Then, the dielectric layer 108 is etched through the patterned hard mask 110a. Thus, at least two contacts I are individually formed in the dielectric layer 108 to expose the source drain S/D.

Figure 1E:
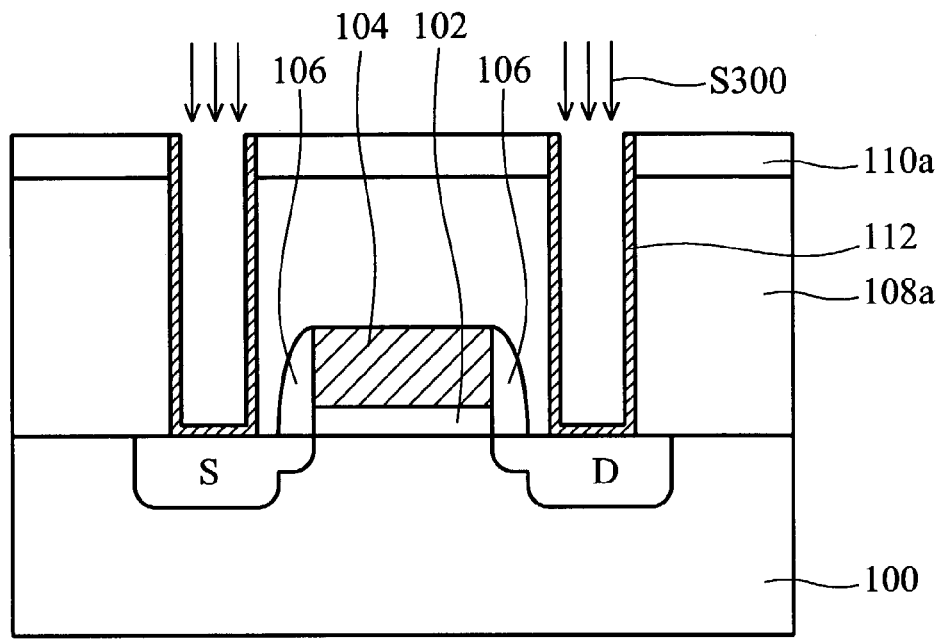

In FIG. 1E, one of the key steps of the present invention is performed. A first cleaning S300 is preferably performed by spin coating a hydrophobic solution with a specific weight of more than 1 in the contact hole I to clean the surface and the side wall of the contact hole I. The hydrophobic solution with a specific weight of more than 1 comprises chlorohydrocarbon comprising chloroform or dichloromethane. The spin rate of the hydrophobic solution with a specific weight of more than 1 is about 800~1000 rpm.

Figure 1F:
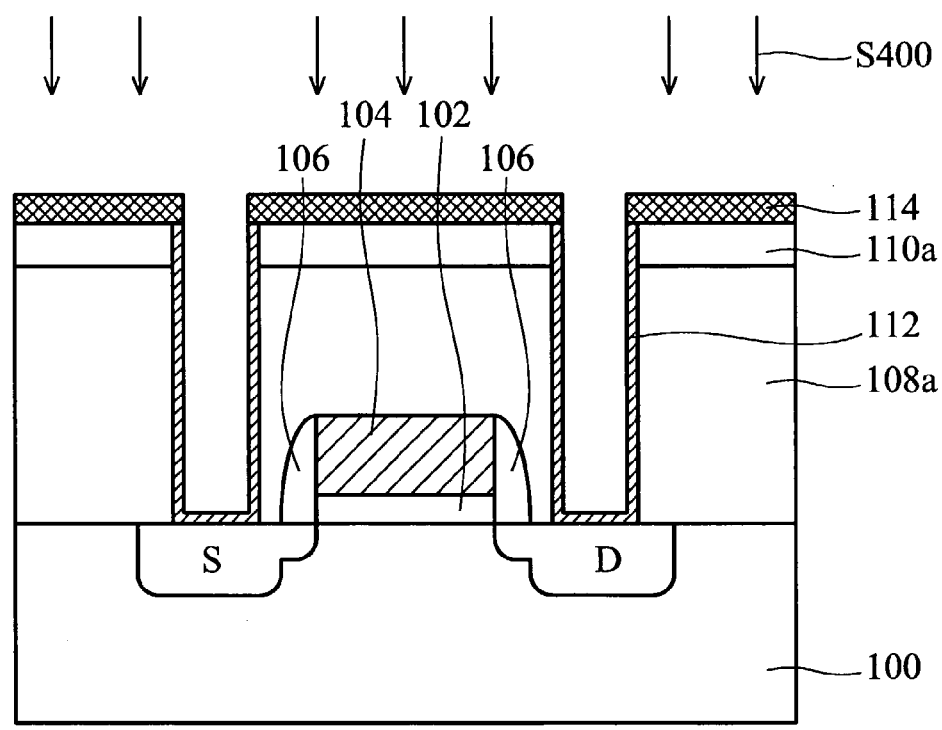

In FIG. 1F, another key step of the present invention is performed. A second cleaning S400 is preferably performed by spin coating a solution containing water on the patterned hard mask 110a to form a chemical oxide serving as an isolated layer 114 on the patterned hard mask 110a. The solution containing water comprises $H_2O_2$. The spin rate of the solution containing water is about 2000~3000 rpm.

After the first cleaning S300 and the second cleaning S400, an isolated layer 114 is formed on the patterned hard mask 110a. The isolated layer 114, however, is not formed in the contact hole I.

According to the present invention, the spin rate of the hydrophobic solution with a specific weight of more than 1 is slower than that of the solution containing water; the chemical oxide 114 is thereby formed only on the patterned hard mask 110a.

Figure 1G:
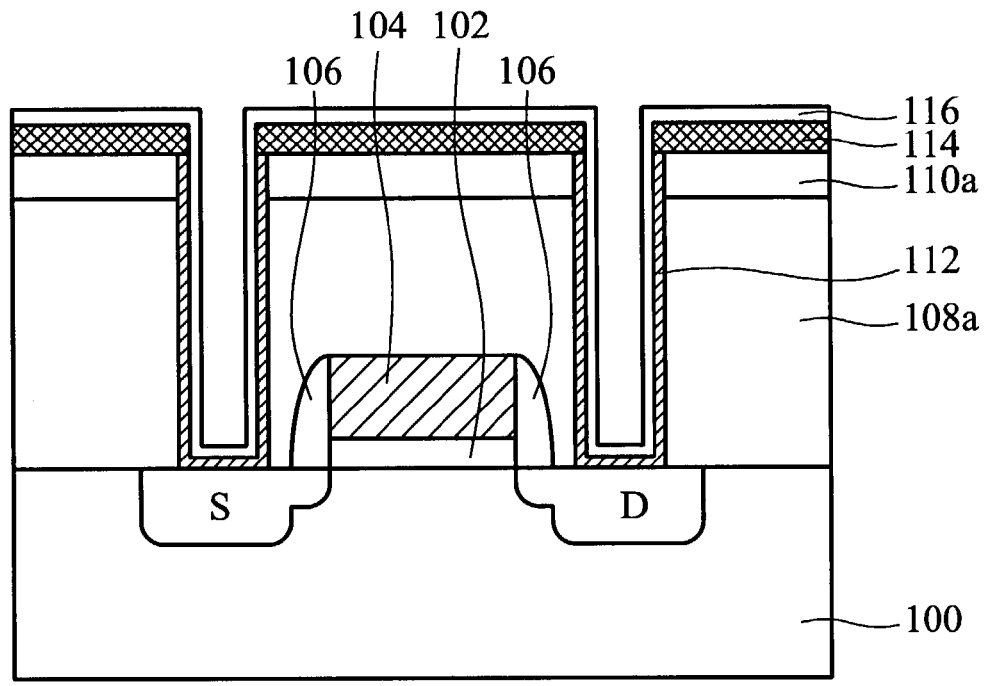

In FIG. 1G, a barrier layer 116 is formed conformally on the isolated layer 110, the side wall of the contact holes, and the source drain S/D. The material of the barrier 116 comprises TiN/Ti.

Figure 1H:
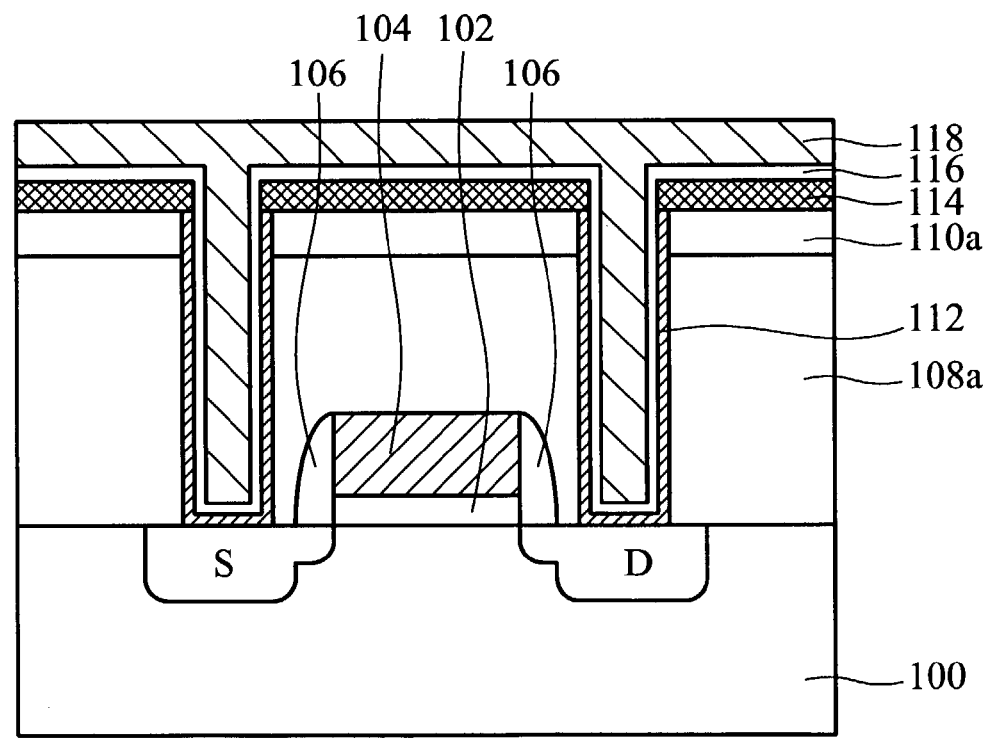

In FIG. 1H, a metal layer 118 is formed to fill the contact holes I and cover on the barrier layer 116. The material of the metal layer 118 comprises tungsten (W).

Figure 1I:
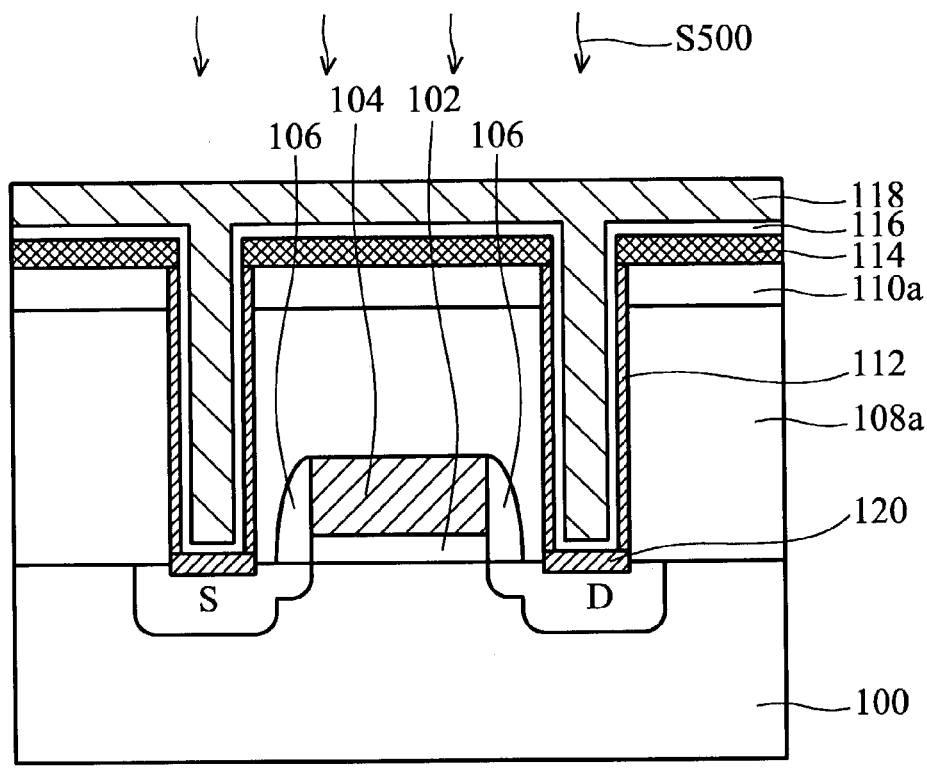

In FIG. 1I, a thermal treatment S500 is performed at the temperature of about 550~600° C. to form a salicide 120 between the barrier layer 116 and the source drain S/D. The salicide 120 can enhance the conductivity between the barrier layer 116 and the source drain S/D. Compared to the prior art, the salicide 120 cannot be formed on the patterned hard mask 110a.

Figure 1J:
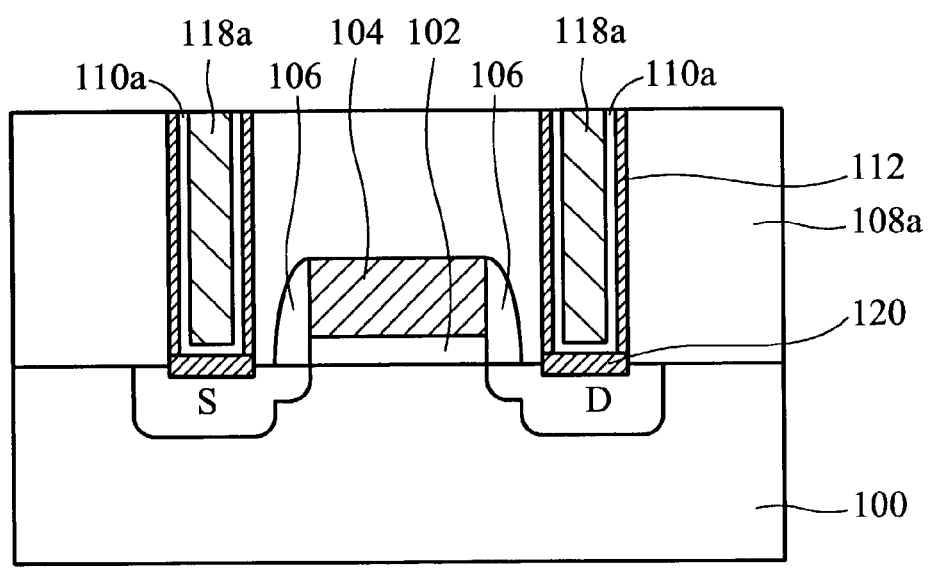

Finally, parts of the metal layer 118, barrier 116, isolated layer 114, and patterned hard mask 110a are preferably removed by chemical mechanical polishing (CMP). The metal plug 118a with a planar surface is thus formed in the contact holes I, as shown in FIG. 1J. According to the present invention, the isolated layer 114 comprising an oxide is formed between the poly-silicon hard mask 110a and TiN/Ti barrier 116 to prevent the poly-silicon hard mask 110a and TiN/Ti barrier 116 from reacting with each other due the formation of silicide which is difficult to remove by chemical mechanical polishing (CMP). The patterned hard mask 110a can be removed completely.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method of forming a metal plug, comprising:
   providing a semiconductor substrate;
   forming a dielectric layer on the semiconductor substrate;
   forming a patterned hard mask on the dielectric layer;
   etching the dielectric layer to form a contact hole in the dielectric layer using the patterned hard mask as a shield so as to expose parts of the semiconductor substrate;
   forming an isolated layer on the patterned hard mask, wherein the isolated layer prevents the patterned hard mask from siliciding;
   conformally forming a barrier layer on the isolated layer and the exposed substrate of the contact hole;
   forming a metal layer to fill the contact hole and cover the barrier layer;
   performing a thermal treatment to form a product between the metal barrier layer and the semiconductor substrate; and
   removing parts of the metal layer, barrier layer, isolated layer, and patterned hard mask so as to form a metal plug in the contact holes.

2. The method as claimed in claim 1, wherein the semiconductor substrate comprises silicon.

3. The method as claimed in claim 2, wherein the product is a silicide.

4. The method as claimed in claim 2, wherein the metal layer comprises tungsten (W).

5. The method as claimed in claim 1, wherein the patterned hard mask comprises poly-silicon.

6. The method as claimed in claim 1, wherein the dielectric layer comprises a boro-phospho silicate glass (BPSG), a high density plasma (HDP) oxide, or tetraethylorthosilicate (TEOS).

7. The method as claimed in claim 1, wherein the barrier comprises TiN/Ti.

8. The method as claimed in claim 1, wherein the step of removing parts of the metal layer, barrier layer, isolated layer, and patterned hard mask is performed by chemical mechanical polishing (CMP).

9. A method of forming a metal plug, comprising:
   providing a silicon substrate comprising a gate structure, a source/drain beside the gate structure, and a dielectric layer covering the gate structure and the source/drain;
   forming a patterned hard mask on the dielectric layer;
   etching the dielectric layer to form at least two contact holes in the dielectric layer using the patterned hard mask as a shield so as to expose the source/drain;
   forming an isolated layer on the patterned hard mask, wherein the isolated layer is adapted to prevent the patterned hard mask from siliciding;
   conformally forming a barrier layer on the isolated layer, the side wall of the contact holes and the source/drain;
   forming a metal layer to fill the contact holes and cover the barrier layer;
   performing a thermal treatment to form a silicide between the metal barrier layer and the substrate; and
   removing parts of the metal layer, barrier layer, isolated layer, and patterned hard mask so as to form a metal plug in the contact holes.

10. The method as claimed in claim 9, wherein the patterned hard mask comprises poly-silicon.

11. The method as claimed in claim 9, wherein the dielectric layer comprises a boro-phospho silicate glass (BPSG), a high density plasma (HDP) oxide, or tetraethylorthosilicate (TEOS).

12. The method as claimed in claim 9, wherein the barrier comprises TiN/Ti.

13. The method as claimed in claim 9, wherein the silicide comprises TiSix.

14. The method as claimed in claim 9, wherein the metal layer comprises tungsten (W).

15. The method as claimed in claim 9, wherein the isolated layer comprises an oxide.

16. The method as claimed in claim 15, wherein the step of forming an oxide comprises:
   spin coating a hydrophobic solution with a specific weight of more than 1 in the contact hole to clean the surface and the side wall of the contact hole; and spin coating a solution containing water on the patterned hard mask to form the oxide on the patterned hard mask.

17. The method as claimed in claim 16, wherein the hydrophobic solution with a specific weight of more than 1 comprises chlorohydrocarbon.

18. The method as claimed in claim 17 wherein the chlorohydrocarbon comprises chloroform or dichloromethane.

19. The method as claimed in claim 16, wherein the solution containing water comprises $H_2O_2$.

20. The method as claimed in claim 16, wherein the spin rate of the hydrophobic solution with a specific weight of more than 1 is about 800~1000 rpm.

21. The method as claimed in claim 16, wherein the spin rate of the solution containing water is about 2000~3000 rpm.

22. The method as claimed in claim 9, wherein the step of removing parts of the metal layer, barrier layer, isolated layer, and patterned hard mask is patterned by chemical mechanical polishing (CMP).

23. A method of forming a metal plug, comprising:
    providing a semiconductor substrate;
    forming a dielectric layer on the semiconductor substrate;
    forming a patterned hard mask on the dielectric layer;
    etching the dielectric layer to form a contact hole in the dielectric layer using the patterned hard mask as a shield so as to expose parts of the semiconductor substrate;
    forming an isolated oxide layer on the patterned hard mask, comprising spin coating a hydrophobic solution with a specific weight of more than 1 in the contact hole to clean the surface and the side wall of the contact hole, and spin coating a solution containing water on the patterned hard mask to form the isolated oxide layer on the patterned hard mask;
    conformally forming a barrier layer on the isolated oxide layer and the exposed semiconductor substrate of the contact holes;
    forming a metal layer to fill the contact hole and cover the barrier layer;
    performing a thermal treatment to form a product between the metal barrier layer and the semiconductor substrate; and
    removing parts of the metal layer, barrier layer, isolated oxide layer, and patterned hard mask so as to form a metal plug in the contact hole.

24. The method as claimed in claim 23, wherein the hydrophobic solution with a specific weight of more than 1 comprises chlorohydrocarbon.

25. The method as claimed in claim 24, wherein the chlorohydrocarbon comprises chloroform or dichloromethane.

26. The method as claimed in claim 23, wherein the solution containing water comprises $H_2O_2$.

27. The method as claimed in claim 23, wherein the spin rate of the hydrophobic solution with a specific weight of more than 1 is about 800~1000 rpm.

28. The method as claimed in claim 23, wherein the spin rate of the solution containing water is about 2000~3000 rpm.

* * * * *